US011598910B2

(12) United States Patent
Nishimura

(10) Patent No.: US 11,598,910 B2
(45) Date of Patent: Mar. 7, 2023

(54) OPTICAL COMMUNICATION DEVICE AND POLARIZATION PLATE SET

(71) Applicant: NITTO DENKO CORPORATION, Ibaraki (JP)

(72) Inventor: Akinori Nishimura, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/349,713

(22) PCT Filed: Nov. 1, 2017

(86) PCT No.: PCT/JP2017/039536
§ 371 (c)(1),
(2) Date: May 14, 2019

(87) PCT Pub. No.: WO2018/092589
PCT Pub. Date: May 24, 2018

(65) Prior Publication Data
US 2019/0317259 A1 Oct. 17, 2019

(30) Foreign Application Priority Data

Nov. 15, 2016 (JP) .............................. JP2016-222241

(51) Int. Cl.
*G02B 5/30* (2006.01)
(52) U.S. Cl.
CPC ............ *G02B 5/305* (2013.01); *G02B 5/3083* (2013.01)
(58) Field of Classification Search
CPC .............................. G02B 5/305; G02B 5/3083
(Continued)

(56) References Cited

U.S. PATENT DOCUMENTS 5,333,072 A * 7/1994 Willett ................. G03B 21/132
349/6
5,530,577 A 6/1996 Orino et al.
(Continued)

FOREIGN PATENT DOCUMENTS

CN 102483474 A 5/2012
CN 104220904 A 12/2014
(Continued)

OTHER PUBLICATIONS

English translation of International Search Report dated May 24, 2018, issued in counterpart International Application Mo. PCT/JP2017/039536. (2 pages).
(Continued)

*Primary Examiner* — Ricky D Shafer
(74) *Attorney, Agent, or Firm* — WHDA, LLP

(57) ABSTRACT

There is provided an optical communication apparatus having high communication stability. An optical communication apparatus of the present invention includes: a signal-transmitting portion; and a signal-receiving portion. The signal-transmitting portion includes a light-emitting element, and a first polarizing plate, which light output from the light-emitting element enters, and which is configured to output polarized light. The signal-receiving portion includes a second polarizing plate, which the light from the signal-transmitting portion enters, and a light-receiving element configured to receive light passing through the second polarizing plate. The first polarizing plate includes a first reflective polarizer.

12 Claims, 4 Drawing Sheets

(58) Field of Classification Search
USPC .................................. 359/485.04, 487.07
See application file for complete search history.

(56) References Cited

U.S. PATENT DOCUMENTS

| | | | | |
|---|---|---|---|---|
| 5,715,023 | A * | 2/1998 | Hoppe | G02B 5/3016 349/11 |
| 5,966,242 | A * | 10/1999 | Yamanaka | G02B 27/0172 359/618 |
| 6,088,067 | A * | 7/2000 | Willett | G02B 5/3033 349/117 |
| 6,101,032 | A * | 8/2000 | Wortman | G02F 1/13362 359/485.02 |
| 6,271,969 | B1 * | 8/2001 | Mertz | G02B 27/0172 359/489.07 |
| 6,414,773 | B1 | 7/2002 | Masuzawa et al. | |
| 6,487,014 | B2 * | 11/2002 | Li | G02B 6/29302 348/E9.027 |
| 6,724,446 | B2 * | 4/2004 | Motomura | G02B 6/0056 349/115 |
| 6,785,049 | B1 * | 8/2004 | Boyd | G02F 1/13362 359/485.03 |
| 6,853,491 | B1 * | 2/2005 | Ruhle | G02B 5/3016 359/630 |
| 6,954,307 | B2 * | 10/2005 | Shao | G02B 6/2746 359/484.04 |
| 6,975,455 | B1 * | 12/2005 | Kotchick | G02B 5/305 359/493.01 |
| 6,995,917 | B1 * | 2/2006 | Sampsell | G02B 27/145 353/34 |
| 7,443,585 | B2 * | 10/2008 | Hara | G02B 5/3016 349/18 |
| 7,492,516 | B2 * | 2/2009 | Takahashi | G02B 5/3066 349/118 |
| 7,746,555 | B2 | 6/2010 | Hara et al. | |
| 7,916,389 | B2 | 3/2011 | Suganuma | |
| 7,982,952 | B2 | 7/2011 | Hara et al. | |
| 8,767,284 | B2 * | 7/2014 | McDowall | G02F 1/29 359/320 |
| 10,001,669 | B2 | 6/2018 | Fuchida et al. | |
| 2005/0151896 | A1 | 7/2005 | Hara et al. | |
| 2006/0232862 | A1 * | 10/2006 | Steven | G02B 3/14 359/489.07 |
| 2008/0100914 | A1 | 5/2008 | Suganuma | |
| 2008/0101796 | A1 | 5/2008 | Iida et al. | |
| 2009/0034070 | A1 | 2/2009 | Hara et al. | |
| 2010/0118242 | A1 | 5/2010 | Barocsi et al. | |
| 2010/0177113 | A1 * | 7/2010 | Gay | G02B 30/27 345/589 |
| 2010/0226007 | A1 | 9/2010 | Hara et al. | |
| 2012/0008096 | A1 * | 1/2012 | Magarill | G02B 27/144 359/487.04 |
| 2012/0154719 | A1 | 6/2012 | Umeda | |
| 2015/0009451 | A1 * | 1/2015 | Zhu | G02F 1/133536 349/64 |
| 2015/0109561 | A1 | 4/2015 | Fuchida et al. | |
| 2015/0226999 | A1 | 8/2015 | Fuchida et al. | |
| 2015/0234106 | A1 * | 8/2015 | Nakamura | G02B 5/305 349/96 |
| 2015/0362728 | A1 | 12/2015 | Tei | |

FOREIGN PATENT DOCUMENTS

| | | |
|---|---|---|
| CN | 104937456 A | 9/2015 |
| CN | 105467497 A | 4/2016 |
| EP | 0851613 A2 | 7/1998 |
| JP | 63-176030 A | 7/1988 |
| JP | H06-104848 A | 4/1994 |
| JP | 9-321705 A | 12/1997 |
| JP | H09-321704 A | 12/1997 |
| JP | H10-276135 A | 10/1998 |
| JP | 2000-241762 A | 9/2000 |
| JP | 2002-341343 A | 11/2002 |
| JP | 2003-172901 A | 6/2003 |
| JP | 2004-029743 A | 1/2004 |
| JP | 2004-214901 A | 7/2004 |
| JP | 2008-107720 A | 5/2008 |
| JP | 2008-268724 A | 11/2008 |
| JP | 2009-276398 A | 11/2009 |
| JP | 2014-224964 A | 12/2014 |

OTHER PUBLICATIONS

Extended (Supplementary) European Search Report dated May 7, 2020, issued in counterpart EP application No. 17871651.0. (9 pages).
Office Action dated Apr. 20, 2021, issued in counterpart JP application No. 2016-222241, with English translation. (11 pages).
Office Action dated Oct. 29, 2021, issued in counterpart to CN application No. 201780070651.X with English translation. (18 pages).
Office Action dated Jul. 1, 2022, issued in counterpart CN Application No. 201780070651.X, with English Translation. (13 pages).
Office Action dated Oct. 21, 2022, issued in counterpart CN application No. 201780070651.X with English translation. (15 pages).

* cited by examiner

OPTICAL COMMUNICATION DEVICE AND POLARIZATION PLATE SET

TECHNICAL FIELD

The present invention relates to an optical communication apparatus and a polarizing plate set to be used in an optical communication apparatus.

BACKGROUND ART

Optical wireless communication using light has heretofore been attracting attention along with circumstances, such as the depletion of a wave band due to an increase in demand for wireless communication using a wave. In particular, along with the spread of a light-emitting element that can be modulated at a high speed, such as a LED, an attempt to put a visible light communication technology using visible light into practical use has been advanced. In such optical communication technology, a signal-transmitting portion including a light-emitting element outputs light modulated in correspondence with a signal to be transmitted, and a signal-receiving portion including a light-receiving element obtains the signal on the basis of received light. In a conventional optical communication technology, an influence of ambient light noise, such as light emitted from a fluorescent lamp, causes a reduction in SN ratio or the overflow of the quantity of the received light in the signal-receiving portion, and as a result, a problem, such as a reduction in communication stability, may occur. In view of the foregoing, the following communication method has been proposed (Patent Literature 1). An absorptive polarizing plate is arranged in each of the signal-transmitting portion and the signal-receiving portion, and polarized light is utilized to transmit a signal, thereby reducing the influence of the ambient light noise.

CITATION LIST

Patent Literature

[PTL 1] JP 09-321705 A

SUMMARY OF INVENTION

Technical Problem

In the communication method of Patent Literature 1, however, part of the light output from the light-emitting element is absorbed by the absorptive polarizing plate. Accordingly, the quantity of the output light in the signal-transmitting portion reduces, and hence communication stability may reduce. Therefore, the quantity of the light output from the light-emitting element needs to be increased for achieving sufficiently high communication stability, and as a result, a power consumption may increase. The present invention has been made in view of the problem, and an object of the present invention is to provide an optical communication apparatus having high communication stability and a polarizing plate set to be used in the optical communication apparatus.

Solution to Problem

An optical communication apparatus according to an embodiment of the present invention includes: a signal-transmitting portion; and a signal-receiving portion. The signal-transmitting portion includes a light-emitting element, and a first polarizing plate, which light output from the light-emitting element enters, and which is configured to output polarized light. The signal-receiving portion includes a second polarizing plate, which the light from the signal-transmitting portion enters, and a light-receiving element configured to receive light passing through the second polarizing plate. The first polarizing plate includes a first reflective polarizer.

In one embodiment of the present invention, the polarized light output from the signal-transmitting portion includes circularly polarized light.

In one embodiment of the present invention, the first reflective polarizer includes a linearly polarized light separation-type reflective polarizer, and the first polarizing plate further includes a $\lambda/4$ plate configured to convert linearly polarized light passing through the first reflective polarizer into circularly polarized light.

In one embodiment of the present invention, the first reflective polarizer includes a circularly polarized light separation-type reflective polarizer.

In one embodiment of the present invention, the polarized light output from the signal-transmitting portion includes linearly polarized light.

In one embodiment of the present invention, the first reflective polarizer includes a linearly polarized light separation-type reflective polarizer.

In one embodiment of the present invention, the first polarizing plate further includes a reflective plate.

In one embodiment of the present invention, the reflective plate has a reflectance of 40% or more.

In one embodiment of the present invention, the second polarizing plate is configured to selectively transmit the polarized light that is output from the signal-transmitting portion and enters the signal-receiving portion.

In one embodiment of the present invention, the second polarizing plate includes a circularly polarized light separation-type reflective polarizer.

In one embodiment of the present invention, the second polarizing plate includes a linearly polarized light separation-type reflective polarizer and a $\lambda/4$ plate.

According to another aspect of the present invention, there is provided a polarizing plate set. The set includes the first polarizing plate and the second polarizing plate to be used in the optical communication apparatus as described above.

Advantageous Effects of Invention

According to the present invention, the optical communication apparatus having high communication stability and the polarizing plate set to be used in the optical communication apparatus can be provided.

DESCRIPTION OF EMBODIMENTS

Embodiments of the present invention are described below. However, the present invention is not limited to these embodiments.

Definitions of Terms and Symbols

The definitions of terms and symbols used herein are as described below.
(1) Refractive Indices (nx, ny, and nz)
"nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.
(2) In-Plane Retardation (Re)
"Re($\lambda$)" refers to an in-plane retardation measured at 23° C. with light having a wavelength of $\lambda$ nm. The Re($\lambda$) is determined from the equation "Re=(nx−ny)×d" when the thickness of a layer (film) is represented by d (nm). For example, "Re(550)" refers to an in-plane retardation measured at 23° C. with light having a wavelength of 550 nm.

A. Entire Construction of Optical Communication Apparatus

Figure 1:
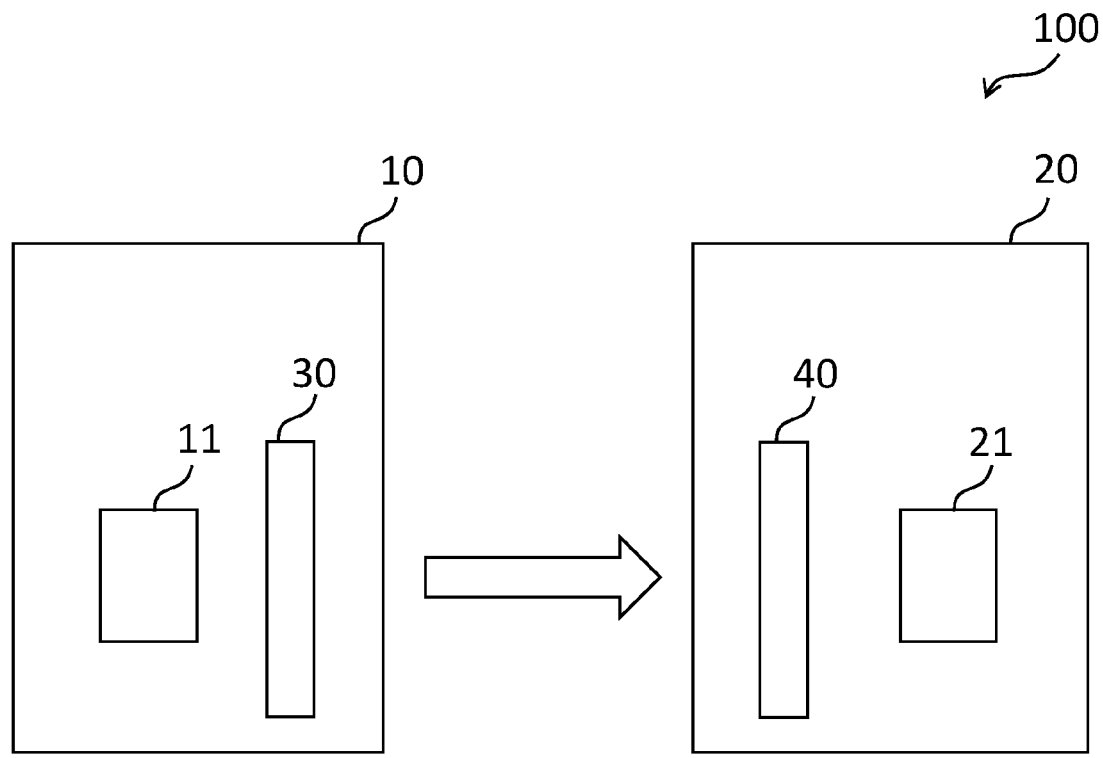
FIG. 1 is a schematic view of an optical communication apparatus according to one embodiment of the present invention.

FIG. 1 is a schematic view of an optical communication apparatus according to one embodiment of the present invention. An optical communication apparatus 100 of this embodiment includes a signal-transmitting portion 10 and a signal-receiving portion 20. The signal-transmitting portion 10 includes a light-emitting element 11, and a first polarizing plate 30 (hereinafter sometimes referred to as "polarizing plate 30"), which light output from the light-emitting element 11 enters, and which is configured to output polarized light. The polarizing plate 30 includes a first reflective polarizer. The polarizing plate 30 preferably further includes a reflective plate. The reflectance of the reflective plate is preferably 40% or more. The polarizing plate 30 preferably includes a light-diffusing layer on the light-emitting element 11 side of the first reflective polarizer. The signal-receiving portion 20 includes a second polarizing plate 40 (hereinafter sometimes referred to as "polarizing plate 40"), which the light from the signal-transmitting portion 10 enters, and alight-receiving element 21 configured to receive light passing through the polarizing plate 40. When the polarizing plate 30 includes the first reflective polarizer, the utilization efficiency of the light output from the light-emitting element 11 can be improved, and as a result, the communication stability of the optical communication apparatus 100 may be improved.

Figure 2:
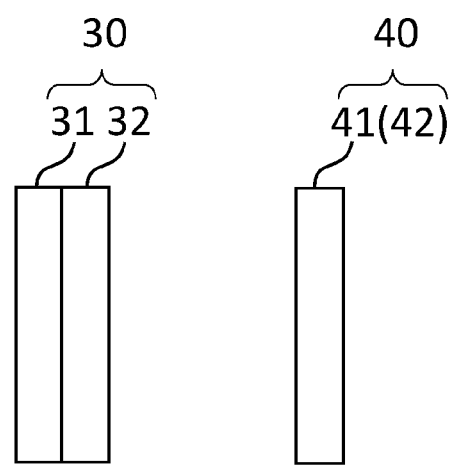
FIG. 2 is a sectional view of the first and second polarizing plates of an optical communication apparatus according to another embodiment of the present invention.

FIG. 2 is a sectional view of the first and second polarizing plates of an optical communication apparatus according to another embodiment of the present invention. The polarized light output from the signal-transmitting portion 10 is preferably circularly polarized light. In one embodiment, as illustrated in FIG. 2, the polarizing plate 30 includes a first reflective polarizer 31 that is of a linearly polarized light separation type and a first $\lambda$/4 plate 32 arranged on the side of the first reflective polarizer 31 opposite to the light-emitting element, and hence outputs the circularly polarized light. In this case, an angle formed by the reflection axis of the first reflective polarizer 31 and the slow axis of the first $\lambda$/4 plate 32 is preferably from 38° to 52°, more preferably from 42° to 48°, most preferably about 45°. In another embodiment, the polarizing plate 30 includes a first reflective polarizer of a circularly polarized light separation type, and hence outputs the circularly polarized light. As illustrated in FIG. 2, the polarizing plate 40 includes an absorptive polarizer 41. The polarizing plate 40 may further include a protective layer (not shown) configured to protect the absorptive polarizer 41. As illustrated in FIG. 2, the polarizing plate 40 may include a second reflective polarizer 42 instead of the absorptive polarizer 41. In this case, the second reflective polarizer 42 is typically a linearly polarized light separation-type reflective polarizer. The polarizing plate 40 absorbs (or reflects) light whose vibration direction is perpendicular to the transmission axis of the absorptive polarizer 41 (or the second reflective polarizer 42) out of ambient light noise, and transmits about a half of the circularly polarized light output from the signal-transmitting portion 10. When the signal-transmitting portion 10 outputs the circularly polarized light, even in the case where an axial shift between the transmission axis of the first reflective polarizer of the signal-transmitting portion 10 and the transmission axis of the polarizer (absorptive polarizer or reflective polarizer) of the signal-receiving portion occurs, a reduction in quantity of the light output from the signal-transmitting portion and received by the light-receiving element of the signal-receiving portion may be suppressed. Further, when the polarizing plate 40 absorbs (or reflects) part of the ambient light noise, the quantity of the ambient light noise entering the light-receiving element may reduce. As a result, a SN ratio in the signal-receiving portion may increase. When the polarizing plate 40 includes the second reflective polarizer, the utilization efficiency of the light output from the light-emitting element can be improved, and hence the SN ratio in the signal-receiving portion may be increased. Meanwhile, in the case where the polarizing plate 40 includes the absorptive polarizer 41, the thickness of the polarizing plate 40 can be reduced as compared to that in the case where the polarizing plate 40 includes the second reflective polarizer 42.

Figure 3:
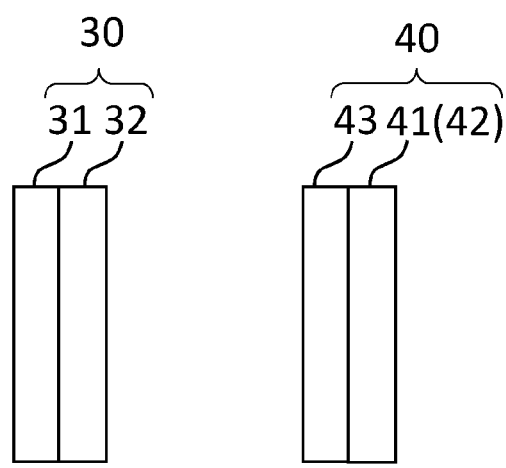
FIG. 3 is a sectional view of the first and second polarizing plates of an optical communication apparatus according to still another embodiment of the present invention.

FIG. 3 is a sectional view of the first and second polarizing plates of an optical communication apparatus according to still another embodiment of the present invention. As illustrated in FIG. 3, the polarizing plate 40 includes the absorptive polarizer 41 and a second $\lambda$/4 plate 43 arranged on the side of the absorptive polarizer 41 opposite to the light-receiving element. An angle formed by the absorption axis of the absorptive polarizer 41 and the slow axis of the second $\lambda$/4 plate 43 is preferably from 38° to 52°, more preferably from 42° to 48°, most preferably about 45°. As illustrated in FIG. 3, the polarizing plate 40 may include the second reflective polarizer 42 of a linearly polarized light separation type instead of the absorptive polarizer 41. In one embodiment, the polarized light output from the signal-transmitting portion 10 is right-handed circularly polarized light, and the polarizing plate 40 selectively transmits the right-handed circularly polarized light and absorbs (or reflects) left-handed circularly polarized light. In another embodiment, the polarized light output from the signal-transmitting portion 10 is left-handed circularly polarized light, and the polarizing plate 40 selectively transmits the left-handed circularly polarized light and absorbs (or reflects) right-handed circularly polarized light. Thus, even in the case where an axial shift between the transmission axis of the first reflective polarizer of the signal-transmitting portion 10 and the transmission axis of the polarizer (absorptive polarizer or reflective polarizer) of the signal-receiving portion occurs, the polarizing plate 40 may ideally transmit the entirety of the circularly polarized light output from the signal-transmitting portion 10. The rotation direction of the circularly polarized light output from the signal-transmitting portion 10 (whether the circularly polarized light is right-handed or left-handed) may be appropriately set by the axial angle of the first λ/4 plate 32 with respect to the reflection axis of the first reflective polarizer 31. The rotation direction of the circularly polarized light transmitted by the polarizing plate 40 (whether the circularly polarized light is right-handed or left-handed) may be appropriately set by the axial angle of the second λ/4 plate 43 with respect to the absorption axis of the absorptive polarizer 41 (or the reflection axis of the second reflective polarizer 42). The polarizing plate 40 may include a circularly polarized light separation-type reflective polarizer configured to selectively transmit the circularly polarized light output from the signal-transmitting portion 10 instead of the absorptive polarizer 41 and the second λ/4 plate 43.

In still another embodiment, the polarized light output from the signal-transmitting portion 10 is linearly polarized light, and as described with reference to FIG. 3, the polarizing plate 40 includes the absorptive polarizer 41 and the second λ/4 plate 43 arranged on the side of the absorptive polarizer 41 opposite to the light-receiving element. The polarizing plate 30 typically includes the first reflective polarizer that is of a linearly polarized light separation type. The polarizing plate 40 selectively transmits the linearly polarized light output from the signal-transmitting portion 10. Specifically, the polarizing plate 40 absorbs right-handed circularly polarized light or left-handed circularly polarized light out of ambient light noise, and transmits about a half of the linearly polarized light output from the signal-transmitting portion 10. As described with reference to FIG. 3, the polarizing plate 40 may include the second reflective polarizer 42 of a linearly polarized light separation type instead of the absorptive polarizer 41, or may include the circularly polarized light separation-type reflective polarizer instead of the absorptive polarizer 41 and the second λ/4 plate 43.

B. Signal-Transmitting Portion

As described above, the signal-transmitting portion 10 includes the light-emitting element 11 and the polarizing plate 30. The polarizing plate 30 includes the first reflective polarizer. The first reflective polarizer may be a linearly polarized light separation-type reflective polarizer, or may be a circularly polarized light separation-type reflective polarizer. The light output from the light-emitting element 11 is output toward the outside of the signal-transmitting portion 10 through the polarizing plate 30. Thus, polarized light is output from the signal-transmitting portion 10.

B-1. Light-Emitting Element

The light-emitting element includes any appropriate element that may output light modulated in correspondence with a signal to be transmitted. The light-emitting element is typically a LED. The light output from the light-emitting element is typically visible light or infrared light. The light-emitting element outputs the light modulated in correspondence with the signal to be transmitted through the use of an electrical signal supplied from a driver circuit (not shown). The light-emitting element typically repeats the flickering of the light in correspondence with the signal to be transmitted.

B-2. First Polarizing Plate

As described above, the polarizing plate 30 includes the first reflective polarizer. The polarizing plate 30 preferably includes the light-diffusing layer on the light-emitting element 11 side of the first reflective polarizer 31. When the first reflective polarizer is a linearly polarized light separation-type reflective polarizer, the polarizing plate 30 preferably includes the first λ/4 plate on the side of the first reflective polarizer 31 opposite to the light-emitting element 11. The first λ/4 plate typically has a slow axis. The angle formed by the reflection axis of the first reflective polarizer 31 and the slow axis of the first λ/4 plate is preferably from 38° to 52°, more preferably from 42° to 48°, most preferably about 45°. Thus, circularly polarized light is output from the first λ/4 plate. When the signal-transmitting portion 10 outputs the circularly polarized light, even in the case where an axial shift between the transmission axis of the first reflective polarizer of the signal-transmitting portion 10 and the transmission axis of the polarizer (absorptive polarizer or reflective polarizer) of the signal-receiving portion occurs, a reduction in quantity of the light output from the signal-transmitting portion and received by the light-receiving element of the signal-receiving portion may be suppressed, and hence the SN ratio in the signal-receiving portion may be increased. The respective components of the polarizing plate 30 may be arranged so as to be separated from each other, or may be bonded to each other via any appropriate adhesion layer (e.g., an adhesive layer or a pressure-sensitive adhesive layer: not shown).

B-2-1. First Reflective Polarizer

The first reflective polarizer has a function of transmitting polarized light in a specific polarization state (polarization direction) and reflecting light in any other polarization state. The first reflective polarizer may be of a linearly polarized light separation type, or may be of a circularly polarized light separation type. When the first reflective polarizer is of a linearly polarized light separation type, linearly polarized light is output from the first reflective polarizer, and when the first reflective polarizer is of a circularly polarized light separation type, circularly polarized light is output from the first reflective polarizer.

B-2-1-1. Linearly Polarized Light Separation-type Reflective Polarizer

Figure 4:
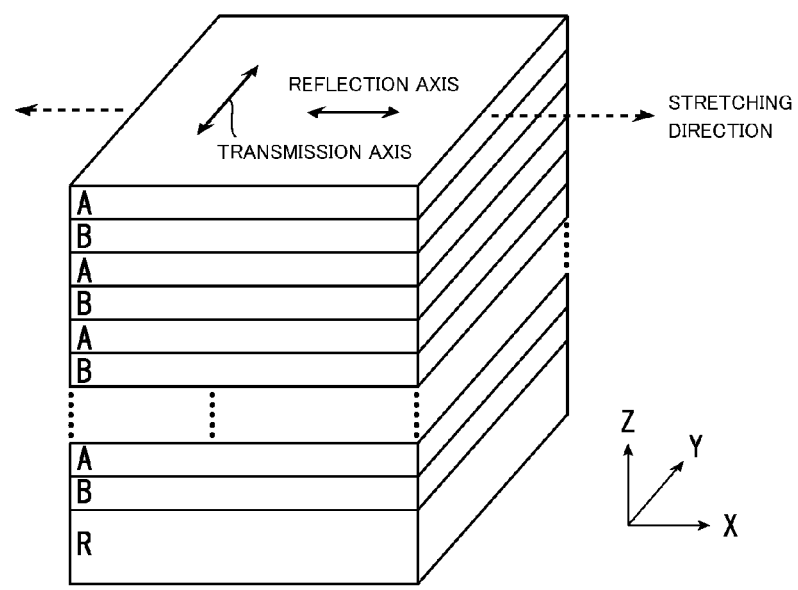
FIG. 4 is a schematic perspective view of an example of a reflective polarizer that may be used in the optical communication apparatus of the present invention.

FIG. 4 is a schematic perspective view of an example of the linearly polarized light separation-type reflective polarizer. The reflective polarizer is a multilayer laminate obtained by alternately laminating a layer A having birefringence and a layer B substantially free of birefringence. For example, the total number of the layers of such multilayer laminate may be from 50 to 1,000. In the illustrated example, a refractive index nx in the x-axis direction of the layer A is larger than a refractive index ny in they-axis direction thereof, and a refractive index nx in the x-axis direction of the layer B and a refractive index ny in the y-axis direction thereof are substantially equal to each other. Therefore, a refractive index difference between the layer A and the layer B is large in the x-axis direction, and is substantially zero in the y-axis direction. As a result, the x-axis direction serves as a reflection axis and the y-axis direction serves as a transmission axis. The refractive index difference between the layer A and the layer B in the x-axis direction is preferably from 0.2 to 0.3. The x-axis direction corresponds to the stretching direction of the reflective polarizer in a production method to be described later.

The layer A preferably includes a material that expresses birefringence when stretched. Typical examples of such material include naphthalenedicarboxylic acid polyester (e.g., polyethylene naphthalate), polycarbonate, and an acrylic resin (e.g., polymethyl methacrylate). Of those, polyethylene naphthalate is preferred. The layer B preferably includes a material that is substantially free of expressing birefringence even when stretched. A typical example of such material is a copolyester of naphthalenedicarboxylic acid and terephthalic acid.

The reflective polarizer transmits light having a first polarization direction (e.g., a p-wave) and reflects light having a second polarization direction perpendicular to the first polarization direction (e.g., a s-wave) at an interface between the layer A and the layer B. Part of the reflected light passes as light having the first polarization direction through the interface between the layer A and the layer B, and the other part thereof is reflected as light having the second polarization direction. Such reflection and transmission are repeated many times in the reflective polarizer, and hence the utilization efficiency of light can be improved.

In one embodiment, the reflective polarizer may include, as illustrated in FIG. 4, a reflective layer R as an outermost layer on a light-emitting element 11 side. When the reflective layer R is arranged, light that has finally returned to the outermost portion of the reflective polarizer without being utilized can be further utilized, and hence the utilization efficiency of the light can be further improved. The reflective layer R typically expresses a reflecting function by virtue of the multilayer structure of a polyester resin layer.

The total thickness of the reflective polarizer may be appropriately set depending on, for example, purposes and the total number of layers in the reflective polarizer. The total thickness of the reflective polarizer is preferably from 10 µm to 150 µm.

The reflective polarizer may be typically produced by combining co-extrusion and lateral stretching. The co-extrusion may be performed by any appropriate system. For example, the system may be a feed block system, or may be a multi-manifold system. For example, a material for forming the layer A and a material for forming the layer B are extruded in a feed block, and are then formed into a plurality of layers with a multiplier. Such apparatus for forming the materials into a plurality of layers is known to one skilled in the art. Next, the resultant multilayer laminate having an elongate shape is typically stretched in a direction (TD) perpendicular to its conveying direction. The material for forming the layer A (e.g., polyethylene naphthalate) is increased in refractive index only in the stretching direction by the lateral stretching, and as a result, expresses birefringence. The material for forming the layer B (e.g., a copolyester of naphthalenedicarboxylic acid and terephthalic acid) is not increased in refractive index in any direction even by the lateral stretching. As a result, a reflective polarizer having a reflection axis in the stretching direction (TD) and having a transmission axis in the conveying direction (MD) can be obtained (TD corresponds to the x-axis direction of FIG. 4, and MD corresponds to the y-axis direction thereof). A stretching operation may be performed with any appropriate apparatus.

A polarizer described in, for example, JP 09-507308 A may be used as the reflective polarizer.

A commercially available product may be used as it is as the reflective polarizer, or the commercially available product may be subjected to secondary processing (e.g., stretching) before use. Examples of the commercially available product include a product available under the product name "APCF" from Nitto Denko Corporation, a product available under the product name "DBEF" from 3M Company, and a product available under the product name "APF" from 3M Company.

B-2-1-2. Circularly Polarized Light Separation-Type Reflective Polarizer

The circularly polarized light separation-type reflective polarizer includes, for example, a cholesteric liquid crystal film. The cholesteric liquid crystal film includes an aligned layer of a cholesteric liquid crystal polymer, and has such a characteristic as to reflect one of left-handed circularly polarized light and right-handed circularly polarized light, and to transmit the other light. The aligned layer of the cholesteric liquid crystal polymer may be formed of a cholesteric liquid crystal polymer having a constituent unit derived from an optically active group-containing monomer. The thickness of the cholesteric liquid crystal film is preferably from 1 µm to 30 µm, more preferably from 2 µm to 15 µm. The cholesteric liquid crystal film may be compounded as required with one or more kinds of additives including: a polymer other than the liquid crystal polymer; an inorganic compound and an organic compound, such as a stabilizer and a plasticizer; and a metal and a compound thereof.

The circularly polarized light separation-type reflective polarizer may include a plurality of cholesteric liquid crystal films. A plurality of cholesteric liquid crystal films having different reflection wavelengths are preferably used. With such construction, a circularly polarized light separation-type reflective polarizer that may provide transmitted circularly polarized light in a wide wavelength range can be formed.

B-2-2. First λ/4 Plate

The thickness of the first λ/4 plate is preferably from 1 µm to 200 µm, more preferably from 1 µm to 100 µm. The first λ/4 plate 32 preferably has a refractive index characteristic of showing a relationship of nx>ny≥nz. Herein, "ny=nz" encompasses not only a case in which ny and nz are exactly equal to each other, but also a case in which ny and nz are substantially equal to each other. Therefore, a relationship of ny<nz may be satisfied without impairing the effects of the present invention.

The in-plane retardation Re(550) of the first λ/4 plate is preferably from 60 nm to 200 nm, more preferably from 80 nm to 140 nm. Linearly polarized light that is output from the first reflective polarizer 31 and enters the first λ/4 plate 32 is converted into circularly polarized light by the first λ/4 plate 32 and output toward the signal-receiving portion.

The birefringence $\Delta n_{xy}$ of the first λ/4 plate is, for example, from 0.0025 to 0.0060, preferably from 0.0028 to 0.0050. When the birefringence is optimized within such range, the first λ/4 plate that is thin and has desired optical characteristics may be obtained. The Nz coefficient of the first λ/4 plate is preferably from 0.9 to 3, more preferably from 0.9 to 1.3.

The first λ/4 plate contains a resin having an absolute value of its photoelastic coefficient of preferably $2 \times 10^{-11}$ m$^2$/N or less, more preferably from $2.0 \times 10^{-13}$ m$^2$/N to $1.6 \times 10^{-11}$ m$^2$/N. When the absolute value of the photoelastic coefficient falls within such range, a retardation change is less liable to be generated in the case where a shrinkage stress is generated at the time of heating.

In one embodiment, the first λ/4 plate may include any appropriate resin film that may satisfy the above-described characteristics. Typical examples of such resin include a cyclic olefin-based resin, a polycarbonate-based resin, a cellulose-based resin, a polyester-based resin, a polyvinyl alcohol-based resin, a polyamide-based resin, a polyimidebased resin, a polyether-based resin, a polystyrene-based resin, and an acrylic resin. Any appropriate polycarbonate resin may be used as the polycarbonate resin as long as the effects of the present invention are obtained. Details of the polycarbonate resin that may be suitably used are described in, for example, JP 2014-10291 A and JP 2014-26266 A, the descriptions of which are incorporated herein by reference.

In another embodiment, the first λ/4 plate may be an alignment fixed layer of a liquid crystal compound. When the liquid crystal compound is used, a difference between nx and ny of the first λ/4 plate to be obtained can be remarkably increased as compared to a non-liquid crystal material, and hence a thickness of the first λ/4 plate for obtaining a desired in-plane retardation can be remarkably reduced. Typically, a rod-shaped liquid crystal compound is aligned in a state of being aligned in the slow axis direction of the first λ/4 plate (homogeneous alignment). Specific examples of the liquid crystal compound and details of a method of forming the alignment fixed layer are described in JP 2006-163343 A, the description of which is incorporated herein by reference. In another embodiment, typically, a disc-shaped liquid crystal compound is aligned in any one of the following states: vertical alignment, hybrid alignment, and tilt alignment. A liquid crystal compound described in JP 2007-108732 A or JP 2010-244038 A may be preferably used as the liquid crystal compound, but the liquid crystal compound is not limited thereto.

B-2-3. Light-Diffusing Layer

The light-diffusing layer typically includes a light-diffusing element. The light-diffusing element includes a matrix and light-diffusive fine particles dispersed in the matrix.

The light-diffusing performance of the light-diffusing layer may be represented by, for example, a haze value and/or a light-diffusing half-value angle. The haze value of the light-diffusing layer is preferably from 10% to 99%, more preferably from 20% to 95%. When the haze value is set within the range, desired diffusing performance is obtained, and hence the output direction of the light from the signal-transmitting portion 10 can be expanded. As a result, the setting contributes to an improvement in communication stability of the optical communication apparatus. The light-diffusing half-value angle of the light-diffusing layer is preferably from 5° to 50°, more preferably from 10° to 30°. The light-diffusing performance of the light-diffusing layer may be controlled by adjusting, for example, a constituent material for the matrix, and a constituent material for, and the volume-average particle diameter and compounding amount of, the light-diffusible fine particles.

The total light transmittance of the light-diffusing layer is preferably 75% or more, more preferably 80% or more, still more preferably 85% or more.

The thickness of the light-diffusing layer may be appropriately adjusted depending on, for example, its configuration and diffusing performance. The thickness of the light-diffusing layer is preferably from 5 μm to 200 μm.

The matrix includes, for example, an ionizing radiation-curable resin. An ionizing radiation is, for example, UV light, visible light, an infrared ray, or an electron beam. Of those, UV light is preferred. Therefore, the matrix preferably includes a UV-curable resin. Examples of the UV-curable resin include an acrylic resin, an aliphatic (e.g., polyolefin) resin, and a urethane-based resin.

Any appropriate light-diffusible fine particles may be used as the light-diffusible fine particles. Details of the light-diffusible fine particles are described in, for example, JP 2014-224964 A, the description of which is incorporated herein by reference in its entirety.

B-3. Reflective Plate

Figure 5:
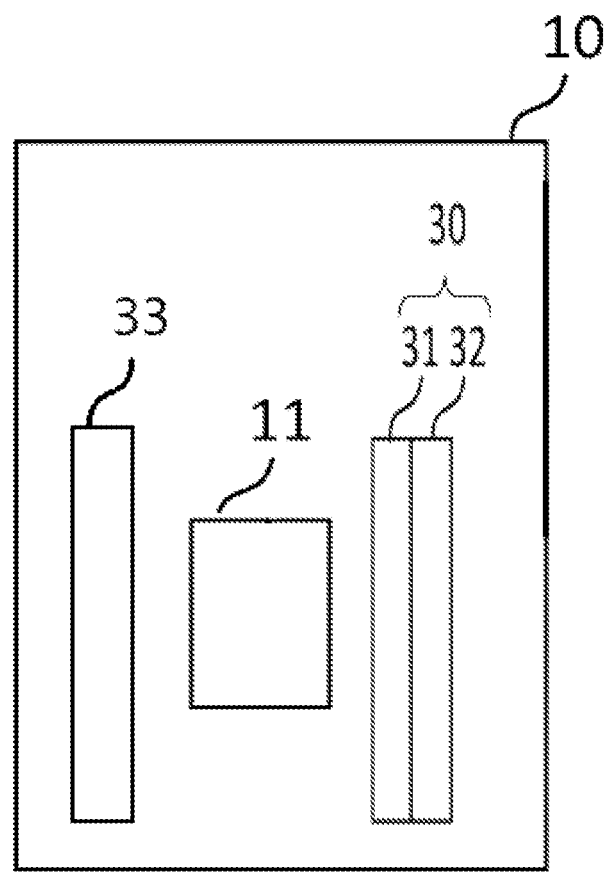
FIG. 5 is a schematic view of the signal-transmitting portion of an optical communication apparatus according to another embodiment of the present invention.

As shown in FIG. 5, the reflective plate 33 is typically arranged on the side of the light-emitting element opposite to the reflective polarizer. Thus, the light output from the light-emitting element backward (toward the side opposite to the reflective polarizer) may be reflected forward by the reflective plate 33. Further, the polarization state of the polarized light reflected backward (toward the light-emitting element) by the reflective polarizer may be converted, and the polarized light may be reflected forward. As a result, the utilization efficiency of the light output from the light-emitting element can be improved.

The reflectance of the reflective plate is preferably 40% or more, more preferably 80% or more. Thus, the utilization efficiency of the light output from the light-emitting element can be further improved.

The reflective plate may include any appropriate material as long as the material has a reflecting function. The reflective plate may be a mirror-surface reflective plate (mirror), or may be a diffusing reflective plate (white plate). For example, a metal sheet or metal foil made of aluminum, silver, stainless steel, or the like serving as a metal having a high reflectance, and a laminate of a substrate and the metal sheet or the metal foil may each be used as the mirror-surface reflective plate. For example, a resin film having fine unevenness for diffusing and reflecting incident light formed on its surface, a deposited sheet obtained by depositing aluminum or the like from the vapor onto a substrate, or a laminate of a substrate and a diffusing layer obtained by mixing many reflective beads may be used as the diffusing reflective plate.

C. Signal-Receiving Portion

The signal-receiving portion 20 includes the light-receiving element 21 and the polarizing plate 40. The light-receiving element 21 receives the light output from the light-emitting element 11 through the polarizing plate 30 and the polarizing plate 40.

C-1. Light-Receiving Element

The light-receiving element includes any appropriate element that may detect the light output from the signal-transmitting portion. The light-receiving element is typically a photodiode. The light-receiving element has sensitivity to the wavelength of the light output from the light-emitting element, and typically has sensitivity to visible light or infrared light. The light-receiving element generates an electrical signal corresponding to the received light, and supplies the signal to an arithmetic circuit (not shown). Thus, the signal-receiving portion may receive a signal corresponding to an electrical signal generated in the control circuit of the signal-transmitting portion.

C-2. Second Polarizing Plate

As described above, the polarizing plate 40 typically includes the absorptive polarizer 41. The polarizing plate 40 may include a protective layer arranged on one side of the absorptive polarizer 41 and a protective layer arranged on the other side of the absorptive polarizer 41. The polarizing plate 40 preferably includes the second reflective polarizer 42 instead of the absorptive polarizer 41. The polarizing plate 40 preferably includes the second λ/4 plate 43 on the side of the absorptive polarizer 41 (or the second reflective polarizer 42) opposite to the light-receiving element 21. The second λ/4 plate 43 typically has a slow axis. The angle formed by the absorption axis of the absorptive polarizer 41 (or the reflection axis of the second reflective polarizer 42) and the slow axis of the second λ/4 plate 43 is preferably from 38° to 52°, more preferably from 42° to 48°, most preferably about 45°. Thus, circularly polarized light entering the second λ/4 plate may be converted into linearly polarized light, and most of the linearly polarized light may pass through the absorptive polarizer 41 (or the second reflective polarizer 42). The absorptive polarizer 41 (or the second reflective polarizer 42) and the second λ/4 plate 43 may be arranged so as to be separated from each other, or may be bonded to each other via any appropriate adhesion layer (e.g., an adhesive layer or a pressure-sensitive adhesive layer: not shown).

C-2-1. Absorptive Polarizer

Any appropriate absorptive polarizer may be adopted as the absorptive polarizer depending on purposes. For example, a resin film for forming the absorptive polarizer may be a single-layer resin film, or may be a laminate of two or more layers.

Specific examples of the absorptive polarizer including a single-layer resin film include: an absorptive polarizer obtained by subjecting a hydrophilic polymer film, such as a polyvinyl alcohol (PVA)-based film, a partially formalized PVA-based film, or an ethylene-vinyl acetate copolymer-based partially saponified film, to dyeing treatment with a dichroic substance, such as iodine or a dichroic dye, and stretching treatment; and a polyene-based alignment film, such as a dehydration-treated product of PVA or a dehydro-chlorination-treated product of polyvinyl chloride. An absorptive polarizer obtained by dyeing the PVA-based film with iodine and uniaxially stretching the resultant is preferably used because the absorptive polarizer is excellent in optical characteristics.

The absorptive polarizer obtained by using the laminate is specifically, for example, an absorptive polarizer obtained by using a laminate of a resin substrate and a PVA-based resin layer (PVA-based resin film) laminated on the resin substrate, or a laminate of a resin substrate and a PVA-based resin layer formed on the resin substrate through application. The absorptive polarizer obtained by using the laminate of the resin substrate and the PVA-based resin layer formed on the resin substrate through application may be produced by, for example, a method involving: applying a PVA-based resin solution to the resin substrate; drying the solution to form the PVA-based resin layer on the resin substrate, thereby providing the laminate of the resin substrate and the PVA-based resin layer; and stretching and dyeing the laminate to turn the PVA-based resin layer into the absorptive polarizer. Details of such method of producing an absorptive polarizer are described in, for example, JP 2012-73580 A, the description of which is incorporated herein by reference in its entirety.

The thickness of the absorptive polarizer is typically from 1 μm to 80 μm. The upper limit of the thickness of the absorptive polarizer is preferably 50 μm, particularly preferably 12 μm. The lower limit of the thickness of the absorptive polarizer is preferably 5 μm. When the thickness of the absorptive polarizer falls within such range, the curling of the polarizer at the time of its heating can be satisfactorily suppressed, and satisfactory appearance durability thereof at the time of the heating is obtained.

The transmittance (also referred to as "single layer transmittance") of the absorptive polarizer for light having a wavelength of 589 nm is preferably 41% or more, more preferably 42% or more. The theoretical upper limit of the single layer transmittance is 50%. In addition, the polarization degree of the polarizer is preferably from 99.5% to 100%, more preferably from 99.9% to 100%.

C-2-2. Second λ/4 Plate

As described above, the angle formed by the absorption axis of the absorptive polarizer 41 and the slow axis of the second λ/4 plate 43 is preferably from 38° to 52°, more preferably from 42° to 48°, most preferably about 45°. When the polarizing plate 40 includes the second reflective polarizer 42 instead of the absorptive polarizer 41, the angle formed by the reflection axis of the second reflective polarizer 42 and the slow axis of the second λ/4 plate 43 is preferably from 38° to 52°, more preferably from 42° to 48°, most preferably about 45°. The construction, function, and the like of the second λ/4 plate 43 are as described in the section B-2-2 for the first λ/4 plate 32.

C-2-3. Second Reflective Polarizer

The construction, function, and the like of the second reflective polarizer 42 are as described in the section B-2-1 for the first reflective polarizer 31.

D. Polarizing Plate Set

The polarizing plates of the present invention may be used as polarizing plates to be arranged in the signal-transmitting portion and signal-receiving portion of an optical communication apparatus. In this case, a polarizing plate set including the polarizing plate of the signal-transmitting portion and the polarizing plate of the signal-receiving portion may be provided.

EXAMPLES

Now, the present invention is specifically described byway of Examples. However, the present invention is by no means limited to these Examples.

The respective members forming the first and second polarizing plates of each of Examples and Comparative Examples were prepared as described below.

(1) Light-Diffusing Layer

A light-diffusing sheet was used as a light-diffusing layer.

(2) Linearly Polarized Light Separation-Type Reflective Polarizer

A linearly polarized light separation-type reflective polarizer (manufactured by 3M Company, product name: "DBEF") was used as a reflective polarizer. For convenience of description, hereinafter, the reflective polarizer of the first polarizing plate is sometimes referred to as "reflective polarizer A," and the reflective polarizer of the second polarizing plate is sometimes referred to as "reflective polarizer B."

(3) Absorptive Polarizer

A polyvinyl alcohol film having a thickness of 80 μm was stretched to 3 times between rolls having different speed ratios while being dyed in an iodine solution at 30° C. having a concentration of 0.3% for 1 minute. After that, the film was stretched until the total stretching ratio became 6 times while being immersed in an aqueous solution at 60° C. containing boric acid at a concentration of 4% and potassium iodide at a concentration of 10% for 0.5 minute. Subsequently, the film was washed by being immersed in an aqueous solution at 30° C. containing potassium iodide at a concentration of 1.5% for 10 seconds, and was then dried at 50° C. for 4 minutes to provide an absorptive polarizer. To each of both surfaces of the absorptive polarizer, a saponified triacetylcellulose film having a thickness of 80 μm was bonded through the use of a polyvinyl alcohol-based adhesive. Thus, an absorptive polarizer with protective layers was produced.

(4) λ/4 Plate

A λ/4 plate obtained by obliquely stretching a cycloolefin-based resin film (manufactured by Zeon Corporation, "ZEONOR ZF-14 FILM") with a tenter stretching machine at a stretching angle of 45° was used as a λ/4 plate. For convenience of description, hereinafter, the λ/4 plate of the first polarizing plate is sometimes referred to as "λ/4 plate A," and the λ/4 plate of the second polarizing plate is sometimes referred to as "λ/4 plate B."

(5) Reflective Plate

A reflective plate A having a reflectance of 80%, a reflective plate B having a reflectance of 60%, a reflective plate C having a reflectance of 40%, or a reflective plate D having a reflectance of 20% was used as a reflective plate.

Example 1

1. First Polarizing Plate

The light-diffusing sheet, the reflective polarizer A, and the λ/4 plate A were laminated in the stated order via a pressure-sensitive adhesive so that an angle formed by the reflection axis of the reflective polarizer A and the slow axis of the λ/4 plate A became 45°. Thus, the first polarizing plate was obtained.

2. Second Polarizing Plate

The reflective polarizer B was used as the second polarizing plate.

3. Production of Optical Communication Apparatus

The polarizing plate of the signal-transmitting portion of an optical communication apparatus and the polarizing plate of the signal-receiving portion thereof were removed. The reflective plate B was mounted to the back surface side of the light-emitting element of the signal-transmitting portion. The first polarizing plate was mounted to the signal-transmitting portion so that the light-diffusing sheet was on a light-emitting element side. The second polarizing plate was mounted to the signal-receiving portion so that the transmission axis of the reflective polarizer A and the transmission axis of the reflective polarizer B were parallel to each other. Thus, an optical communication apparatus of this example was produced.

Example 2

An optical communication apparatus was produced in the same manner as in Example 1 except that the second polarizing plate was mounted to the signal-receiving portion so that an angle formed by the transmission axis of the reflective polarizer A and the transmission axis of the reflective polarizer B became 45°.

Example 3

An optical communication apparatus was produced in the same manner as in Example 1 except that the second polarizing plate was mounted to the signal-receiving portion so that the transmission axis of the reflective polarizer A and the transmission axis of the reflective polarizer B were perpendicular to each other.

Example 4

1. Production of Second Polarizing Plate

The reflective polarizer B and the λ/4 plate B were laminated via a pressure-sensitive adhesive so that an angle formed by the reflection axis of the reflective polarizer B and the slow axis of the λ/4 plate B became 45°. Thus, the second polarizing plate was obtained.

2. Production of Optical Communication Apparatus

An optical communication apparatus was produced in the same manner as in Example 1 except that the above-described second polarizing plate was mounted to the signal-receiving portion so that the reflective polarizer B was on a light-receiving element side.

Example 5

An optical communication apparatus was produced in the same manner as in Example 4 except that the reflective plate A was used as a reflective plate.

Example 6

An optical communication apparatus was produced in the same manner as in Example 4 except that the reflective plate C was used as a reflective plate.

Example 7

An optical communication apparatus was produced in the same manner as in Example 4 except that the reflective plate D was used as a reflective plate.

Example 8

An optical communication apparatus was produced in the same manner as in Example 4 except that the second polarizing plate was mounted to the signal-receiving portion so that an angle formed by the transmission axis of the reflective polarizer A and the transmission axis of the reflective polarizer B became 45°.

Example 9

An optical communication apparatus was produced in the same manner as in Example 4 except that the second polarizing plate was mounted to the signal-receiving portion so that the transmission axis of the reflective polarizer A and the transmission axis of the reflective polarizer B were perpendicular to each other.

Example 10

1. Production of Second Polarizing Plate

The absorptive polarizer with protective layers and the λ/4 plate B were laminated via a pressure-sensitive adhesive so that an angle formed by the absorption axis of the absorptive polarizer and the slow axis of the λ/4 plate B became 45°. Thus, the second polarizing plate was obtained.

2. Production of Optical Communication Apparatus

An optical communication apparatus was produced in the same manner as in Example 4 except that the above-described second polarizing plate was mounted to the signal-receiving portion so that the absorptive polarizer with protective layers was on the light-receiving element side, and so that the transmission axis of the reflective polarizer A and the transmission axis of the absorptive polarizer were parallel to each other.

Example 11

An optical communication apparatus was produced in the same manner as in Example 10 except that the second polarizing plate was mounted to the signal-receiving portion so that an angle formed by the transmission axis of the reflective polarizer A and the transmission axis of the absorptive polarizer became 45°.

Example 12

An optical communication apparatus was produced in the same manner as in Example 10 except that the second polarizing plate was mounted to the signal-receiving portion so that the transmission axis of the reflective polarizer A and the transmission axis of the absorptive polarizer were perpendicular to each other.

Example 13

1. Production of First Polarizing Plate

The light-diffusing sheet and the reflective polarizer A were laminated via a pressure-sensitive adhesive to provide the first polarizing plate.

2. Production of Optical Communication Apparatus

An optical communication apparatus was produced in the same manner as in Example 1 except that the above-described first polarizing plate was used.

Example 14

An optical communication apparatus was produced in the same manner as in Example 13 except that the second polarizing plate was mounted to the signal-receiving portion so that an angle formed by the transmission axis of the reflective polarizer A and the transmission axis of the reflective polarizer B became 45°.

Example 15

1. Production of Second Polarizing Plate

The reflective polarizer B and the $\lambda/4$ plate B were laminated via a pressure-sensitive adhesive so that an angle formed by the reflection axis of the reflective polarizer B and the slow axis of the $\lambda/4$ plate B became 45°. Thus, the second polarizing plate was obtained.

2. Production of Optical Communication Apparatus

An optical communication apparatus was produced in the same manner as in Example 13 except that the above-described second polarizing plate was used.

Example 16

An optical communication apparatus was produced in the same manner as in Example 15 except that the second polarizing plate was mounted to the signal-receiving portion so that an angle formed by the transmission axis of the reflective polarizer A and the transmission axis of the reflective polarizer B became 45°.

Example 17

An optical communication apparatus was produced in the same manner as in Example 15 except that the second polarizing plate was mounted to the signal-receiving portion so that the transmission axis of the reflective polarizer A and the transmission axis of the reflective polarizer B were perpendicular to each other.

Comparative Example 1

An optical communication apparatus was produced in the same manner as in Example 1 except that the first polarizing plate and the second polarizing plate were not used, and only the light-diffusing sheet was mounted to the signal-transmitting portion.

Comparative Example 2

An optical communication apparatus was produced in the same manner as in Example 1 except that the first polarizing plate was used and the second polarizing plate was not used.

Comparative Example 3

An optical communication apparatus was produced in the same manner as in Example 13 except that the first polarizing plate was used and the second polarizing plate was not used.

Comparative Example 4

1. First Polarizing Plate

The light-diffusing sheet and the absorptive polarizer with protective layers were laminated via a pressure-sensitive adhesive to provide the first polarizing plate.

2. Production of Optical Communication Apparatus

An optical communication apparatus was produced in the same manner as in Example 1 except that the above-described first polarizing plate was used and the second polarizing plate was not used.

Comparative Example 5

An optical communication apparatus was produced in the same manner as in Comparative Example 4 except that: the reflective polarizer B was used as the second polarizing plate; and the second polarizing plate was mounted to the signal-receiving portion so that the transmission axis of the absorptive polarizer and the transmission axis of the reflective polarizer B were parallel to each other.

Comparative Example 6

An optical communication apparatus was produced in the same manner as in Comparative Example 5 except that the second polarizing plate was mounted to the signal-receiving portion so that an angle formed by the transmission axis of the absorptive polarizer and the transmission axis of the reflective polarizer B became 45°.

Comparative Example 7

An optical communication apparatus was produced in the same manner as in Comparative Example 5 except that the second polarizing plate was mounted to the signal-receiving portion so that the transmission axis of the absorptive polarizer and the transmission axis of the reflective polarizer B were perpendicular to each other.

Comparative Example 8

1. Production of Second Polarizing Plate

The reflective polarizer B and the $\lambda/4$ plate B were laminated via a pressure-sensitive adhesive so that an angle formed by the reflection axis of the reflective polarizer B and the slow axis of the $\lambda/4$ plate B became 45°. Thus, the second polarizing plate was obtained.

2. Production of Optical Communication Apparatus

An optical communication apparatus was produced in the same manner as in Comparative Example 5 except that the above-described second polarizing plate was used.

Comparative Example 9

An optical communication apparatus was produced in the same manner as in Comparative Example 8 except that the reflective polarizer B was mounted to the signal-receiving portion so that an angle formed by the transmission axis of the absorptive polarizer and the transmission axis of the reflective polarizer B became 45°.

Comparative Example 10

An optical communication apparatus was produced in the same manner as in Comparative Example 8 except that the reflective polarizer B was mounted to the signal-receiving portion so that the transmission axis of the absorptive polarizer and the transmission axis of the reflective polarizer B were perpendicular to each other.

The optical communication apparatus, and first and second polarizing plates of each of Examples and Comparative Examples were evaluated as described below.
(1) Evaluation of Optical Communication Apparatus for its Communication Stability The signal-transmitting portion and signal-receiving portion of the optical communication apparatus of each of Examples and Comparative Examples were arranged opposite to each other so that a distance between the light-emitting element and the light-receiving element became 2 m. A spot light source (manufactured by Hayashi Watch-Works Co., Ltd., product name: "LA-HDF108AS") was arranged so that the light incident surface (second polarizing plate) of the signal-receiving portion was irradiated with light from a position distant by 20 cm at an angle of incidence of 45°. In the arrangement, the signal-receiving portion was irradiated with light having a brightness of 353,200 cd/m² by using the spot light source while a signal was transmitted from the signal-transmitting portion to the signal-receiving portion. The optical communication apparatus of each of Examples and Comparative Examples was evaluated for its communication stability by the following criteria. The results are shown in Table 1.

The signal transmission from the signal-transmitting portion to the signal-receiving portion was not interrupted by the irradiation with the light from the spot light source . . . . The communication stability is high (○).

The signal transmission from the signal-transmitting portion to the signal-receiving portion was interrupted by the irradiation with the light from the spot light source . . . . The communication stability is low (x).
(2) Brightness of Light Passing Through First and Second Polarizing Plates The first and second polarizing plates used in the optical communication apparatus of each of Examples and Comparative Examples were arranged opposite to each other with an interval of 1 cm therebetween. A LED light source was arranged on the side of the first polarizing plate opposite to the second polarizing plate, and the brightness L of the LED light source was measured with a brightness meter (manufactured by Konica Minolta, Inc., product name: "LS-110") through the first and second polarizing plates arranged opposite to each other. The results are shown in Table 1.

TABLE 1

| | Reflectance of reflective plate (%) | First polarizing plate | | | Second polarizing plate | L (cd/m²) | Communication stability |
|---|---|---|---|---|---|---|---|
| Example 1 | 60 | Reflective polarizer A | λ/4 plate A | | Reflective polarizer B (0) | 12,410 | ○ |
| Example 2 | 60 | Reflective polarizer A | λ/4 plate A | | Reflective polarizer B (45) | 12,130 | ○ |
| Example 3 | 60 | Reflective polarizer A | λ/4 plate A | | Reflective polarizer B (90) | 12,140 | ○ |
| Example 4 | 60 | Reflective polarizer A | λ/4 plate A | λ/4 plate B | Reflective polarizer B (0) | 14,220 | ○ |
| Example 5 | 80 | Reflective polarizer A | λ/4 plate A | λ/4 plate B | Reflective polarizer B (0) | 15,998 | ○ |
| Example 6 | 40 | Reflective polarizer A | λ/4 plate A | λ/4 plate B | Reflective polarizer B (0) | 12,443 | ○ |
| Example 7 | 20 | Reflective polarizer A | λ/4 plate A | λ/4 plate B | Reflective polarizer B (0) | 10,665 | ○ |
| Example 8 | 60 | Reflective polarizer A | λ/4 plate A | λ/4 plate B | Reflective polarizer B (45) | 14,120 | ○ |
| Example 9 | 60 | Reflective polarizer A | λ/4 plate A | λ/4 plate B | Reflective polarizer B (90) | 14,180 | ○ |
| Example 10 | 60 | Reflective polarizer A | λ/4 plate A | λ/4 plate B | Absorptive polarizer (0) | 11,240 | ○ |
| Example 11 | 60 | Reflective polarizer A | λ/4 plate A | λ/4 plate B | Absorptive polarizer (45) | 11,030 | ○ |
| Example 12 | 60 | Reflective polarizer A | λ/4 plate A | λ/4 plate B | Absorptive polarizer (90) | 11,010 | ○ |
| Example 13 | 60 | Reflective polarizer A | | | Reflective polarizer B (0) | 14,820 | ○ |
| Example 14 | 60 | Reflective polarizer A | | | Reflective polarizer B (45) | 11,690 | ○ |
| Example 15 | 60 | Reflective polarizer A | | λ/4 plate B | Reflective polarizer B (0) | 12,130 | ○ |
| Example 16 | 60 | Reflective polarizer A | | λ/4 plate B | Reflective polarizer B (45) | 11,710 | ○ |

TABLE 1-continued

| | Reflectance of reflective plate (%) | First polarizing plate | | Second polarizing plate | L (cd/m²) | Communication stability |
|---|---|---|---|---|---|---|
| Example 17 | 60 | Reflective polarizer A | λ/4 plate B | Reflective polarizer B (90) | 11,460 | ○ |
| Comparative Example 1 | 60 | | | | 20,550 | x |
| Comparative Example 2 | 60 | Reflective polarizer A | λ/4 plate A | | 15,970 | x |
| Comparative Example 3 | 60 | Reflective polarizer A | | | 15,720 | x |
| Comparative Example 4 | 60 | Absorptive polarizer | | | 9,338 | x |
| Comparative Example 5 | 60 | Absorptive polarizer | | Reflective polarizer B (0) | 8,743 | x |
| Comparative Example 6 | 60 | Absorptive polarizer | | Reflective polarizer B (45) | 5,248 | x |
| Comparative Example 7 | 60 | Absorptive polarizer | | Reflective polarizer B (90) | 702 | x |
| Comparative Example 8 | 60 | Absorptive polarizer | λ/4 plate B | Reflective polarizer B (0) | 5,490 | x |
| Comparative Example 9 | 60 | Absorptive polarizer | λ/4 plate B | Reflective polarizer B (45) | 5,238 | x |
| Comparative Example 10 | 60 | Absorptive polarizer | λ/4 plate B | Reflective polarizer B (90) | 5,048 | x |

The description of the light-diffusing layer in the first polarizing plate is omitted.
A numerical value in parentheses in the second polarizing plate represents an angle (°) formed by the transmission axis of the polarizer of the first polarizing plate and the transmission axis of the polarizer of the second polarizing plate.

As is apparent from Table 1, an optical communication apparatus in which the first polarizing plate on a signal-transmitting portion side includes a reflective polarizer has high communication stability. In addition, as is apparent from Examples 4 to 7, as the reflectance of a reflective plate becomes higher, the quantity of the light passing through the first and second polarizing plates increases.

INDUSTRIAL APPLICABILITY

The optical communication apparatus of the present invention may be suitably used in an electronic instrument mounted with an optical wireless communication function. The optical communication apparatus of the present invention may be specifically used in various applications including: portable instruments, such as a personal digital assistant (PDA), a cellular phone, a digital camera, and a portable game machine; OA instruments, such as a personal computer monitor, a laptop personal computer, and a copying machine; home electric appliances, such as a video camera, a liquid crystal television, and a microwave oven; and information monitors for commercial stores.

REFERENCE SIGNS LIST

10 signal-transmitting portion
11 light-emitting element
20 signal-receiving portion
21 light-receiving element
30 first polarizing plate
31 first reflective polarizer
32 first λ/4 plate
33 reflective plate
40 second polarizing plate
41 absorptive polarizer
42 second reflective polarizer
43 second λ/4 plate
100 optical communication apparatus

The invention claimed is:

1. An optical communication apparatus, comprising:
   a signal-transmitting portion; and
   a signal-receiving portion,
   wherein the signal-transmitting portion includes
      a light-emitting element, and
      a first polarizing plate, which light output from the light-emitting element enters, and which is configured to output polarized light,
   wherein the signal-receiving portion includes
      a second polarizing plate, which the light from the signal-transmitting portion enters, and
      a light-receiving element configured to receive light passing through the second polarizing plate,
   wherein the first polarizing plate includes a first reflective polarizer,
   a reflective plate is arranged on a side of the light-emitting element opposite to the first reflective polarizer, and
   the second polarizing plate is configured to selectively transmit the polarized light that is output from the signal-transmitting portion and enters the signal-receiving portion, the second polarizing plate includes a circularly polarized light separation-type reflective polarizer.

2. The optical communication apparatus according to claim 1, wherein the polarized light output from the signal-transmitting portion comprises circularly polarized light.

3. The optical communication apparatus according to claim 2,
   wherein the first reflective polarizer comprises a linearly polarized light separation-type reflective polarizer, and
   wherein the first polarizing plate further includes a λ/4 plate configured to convert linearly polarized light passing through the first reflective polarizer into circularly polarized light.

4. The optical communication apparatus according to claim 2, wherein the first reflective polarizer comprises a circularly polarized light separation-type reflective polarizer.

5. The optical communication apparatus according to claim 1, wherein the polarized light output from the signal-transmitting portion comprises linearly polarized light.

6. The optical communication apparatus according to claim 5, wherein the first reflective polarizer comprises a linearly polarized light separation-type reflective polarizer.

7. An optical communication apparatus, comprising:
a signal-transmitting portion; and
a signal-receiving portion,
wherein the signal-transmitting portion includes
a light-emitting element, and
a first polarizing plate, which light output from the light-emitting element enters, and which is configured to output polarized light,
wherein the signal-receiving portion includes
a second polarizing plate, which the light from the signal-transmitting portion enters, and
a light-receiving element configured to receive light passing through the second polarizing plate,
wherein the first polarizing plate includes a first reflective polarizer,
a reflective plate is arranged on a side of the light-emitting element opposite to the first reflective polarizer, and
the second polarizing plate is configured to selectively transmit the polarized light that is output from the signal-transmitting portion and enters the signal-receiving portion, the second polarizing plate includes a linearly polarized light separation-type reflective polarizer and a λ/4 plate.

8. The optical communication apparatus according to claim 7, wherein the polarized light output from the signal-transmitting portion comprises circularly polarized light.

9. The optical communication apparatus according to claim 8,
wherein the first reflective polarizer comprises a linearly polarized light separation-type reflective polarizer, and
wherein the first polarizing plate further includes a λ/4 plate configured to convert linearly polarized light passing through the first reflective polarizer into circularly polarized light.

10. The optical communication apparatus according to claim 8, wherein the first reflective polarizer comprises a circularly polarized light separation-type reflective polarizer.

11. The optical communication apparatus according to claim 7, wherein the polarized light output from the signal-transmitting portion comprises linearly polarized light.

12. The optical communication apparatus according to claim 11, wherein the first reflective polarizer comprises a linearly polarized light separation-type reflective polarizer.

* * * * *